United States Patent [19]

Saito et al.

[11] Patent Number: 4,887,134
[45] Date of Patent: Dec. 12, 1989

[54] SEMICONDUCTOR DEVICE HAVING A SEMICONDUCTOR REGION IN WHICH EITHER THE CONDUCTION OR VALENCE BAND REMAINS FLAT WHILE BANDGAP IS CONTINUOUSLY GRADED

[75] Inventors: Keishi Saito, Nabari; Yasushi Fujioka, Ueno, both of Japan

[73] Assignee: Canon Kabushiki Kaisha, Tokyo, Japan

[21] Appl. No.: 98,791

[22] Filed: Sep. 21, 1987

[30] Foreign Application Priority Data

Sep. 26, 1986 [JP] Japan .................. 61-229246

[51] Int. Cl.$^4$ ............... H01L 29/04; H01L 29/16; H01L 29/70
[52] U.S. Cl. .......................... 357/16; 357/2; 357/4; 357/34
[58] Field of Search ............... 357/2, 16, 34, 4

[56] References Cited

U.S. PATENT DOCUMENTS 4,254,429 3/1981 Yamazaki ................. 357/2
4,353,081 10/1982 Allyn ..................... 357/16
4,460,669 7/1984 Ogawa et al. ............. 357/2
4,710,786 12/1987 Ovshinsky et al. ......... 357/2

FOREIGN PATENT DOCUMENTS 0178004 4/1986 European Pat. Off. ....... 357/34
2150751 7/1985 United Kingdom ........... 357/30

Primary Examiner—Andrew J. James
Assistant Examiner—Jerome Jackson, Jr.
Attorney, Agent, or Firm—Fitzpatrick, Cella, Harper & Scinto

[57] ABSTRACT

An improved semiconductor device such as an improved graded band gap transistor and an improved graded band gap diode, characterized by comprising a non-single-crystal material containing silicon atom, a band gap adjusting atom and a localized level reducing atom and having a region in which a band gap continuously graded at least one position other than junction position and only one of a conduction band and a valence band being continuously graded. It gives a significant improvement in both the frequency characteristic and the photoresponse.

10 Claims, 8 Drawing Sheets

SEMICONDUCTOR DEVICE HAVING A SEMICONDUCTOR REGION IN WHICH EITHER THE CONDUCTION OR VALENCE BAND REMAINS FLAT WHILE BANDGAP IS CONTINUOUSLY GRADED

FIELD OF THE INVENTION

This invention relates to a semiconductor device comprising a non-single-crystal material. More particularly it relates to a semiconductor device including a transistor and a diode which has a region with a band gap which is continuously graded at least one position other than junction position and with only one of a conduction band and a valence band which is continuously graded.

Such transistor and diode are hereinafter respectively called "graded band gap transistor" and "graded band gap diode".

BACKGROUND OF THE INVENTION

Hitherto, there have been proposed various transistors or diodes having a semiconductor region in which the width of a forbidden band (namely, a band gap) is graded in a like-tapered form, and are effective in speeding up the frequency response and photoresponse, in the case of using them as a phototransistor or a photodiode.

However, for these transistors or diodes, studies have been focused on using a crystal semiconductor, particularly GaAs (Al) semiconductor wherein a transistor or a diode can be prepared in accordance with molecular beam epitaxy method. [see, F. Capasso, Surface Science, 142, pp. 513-528 (1984)].

In the molecular beam epitaxy method, the film forming operation is practiced in an ultra-high vacuum atmosphere, and the deposition rate of the semiconductor film formed on a substrate is slow. In addition, it is not only difficult to mass-produce such film but also to produce large square measure. Further in addition, Ga and As raw materials are troublesome since they are harmful to man.

Other than the above, it has been attempted to prepare such semiconductor devices using easily obtainable Si and Ge as raw materials. However, it is commonly recognized that it is difficult to make a single crystal film which free from undesired structural defects using such raw materials since the grading constants of Si and Ge are different each other.

In this respect, studies have focused on a non-single-crystal SiGe film which is usable for the preparation of a solar cell and a photosensor. In the case of this non-single-crystal film, there are advantages that such it is not necessary to consider the above problems relating to such differences among the constituent materials, the structural freedom is large, dangling bonds can be easily compensated with hydrogen atom or halogen atom such as fluorine, and because of all of this, an objective non-single-crystal SiGe film can be effectively formed.

In addition, the band gap of the non-single-crystal SiGe film, can be continuously varied by changing the proportions of Si and Ge to be contained therein.

Likewise, various studies have been made also on non-single crystal SiC, SiN and SiO films, which are usable for the preparation of the above mentioned semiconductor devices.

For such non-single-crystal films, it is also possible to continuously grade their band gaps by changing the proportions of their constituent elements.

However, it has not yet become possible to obtain a desired highly efficient transistor, diode, etc. by using these non-single-crystal films because of their low mobilities although, there is a proposal for the preparation of a transistor or photodiode having a hetero junction using such non-single-crystal film as disclosed in U.S. Pat. No. 4,254,429 which is aimed at preventing defects or/and mismatches from the interface between the constituent layers. Because of this, even in that publication, a highly efficient transistor or diode has not yet be attained.

Referring to the semiconductor devices disclosed in U.S. Pat. No. 4,254,429, when a semiconductor film in which both the conduction band and the valence band is inclined against a Fermi level and which has a band gap expanded towards the other direction, that is to say, while forming a funnel-like shaped band gap, the device characteristics may be raised since a carrier of either a hole or an electron is apt to be accumulated.

For instance, in the case where said device is employed as a transistor, it has low transistor characteristics or where it is employed as a diode, such diode has low diode characteristics.

Further, in the case where said device is employed as a solar cell, it is not possible to desirably increase any of short circuit current (Isc), open circuit voltage (Voc) and Fill factor (FF).

SUMMARY OF THE INVENTION

This invention is aimed at improving the frequency characteristics of known semiconductor devices such as transistor and diode comprising a non-single-crystal semiconductor film.

Another object of this invention is an improved semiconductor device including an improved transistor and an improved diode which can be mass-produced on a commercial basis.

A further object of this invention is to provide an improved semiconductor including an improved transistor and an improved diode which exhibits improved photoresponse.

DESCRIPTION OF THE INVENTION

Figure 1:
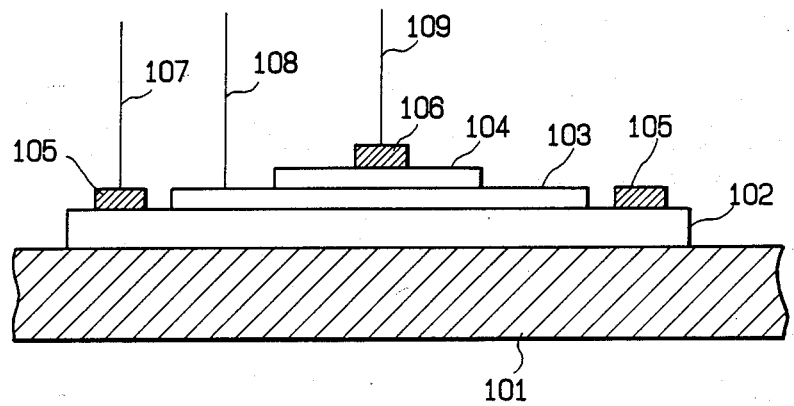
FIG. 1 is a schematic view illustrating a representative embodiment of a configuration for a graded band gap transistor according to this invention.

The present inventor has made extensive studies for attaining the objects described above and as a result, has accomplished this invention based on the findings as described below.

That is, it has been firstly found the fact that a semiconductor comprising a non-single-crystal material (such as amorphous material or polycrystal material, which does not require that the lattice constants of the constituents be matched and which is, on the other hand, of a small mobility, can be effectively used in order to attain the objects of this invention.

Another finding is that in the case where such semiconductor is combined with a transistor in which a base region having a band gap structure graded in a tapered shape (namely, graded band gap transistor) is provided, there can be obtained an improved phototransistor which is quickly responsive to optical spectrum.

A further finding is that in the case where such semiconductor is combined with a diode which has a semiconductor region having a band gap structure graded in a tapered-like shape (namely, graded band gap diode), there can be obtained an improved photodiode which is quickly responsive to optical spectrum.

A still further finding is that for non-single-crystal materials, it is possible to make such a semiconductor material, for example, of A-SiC, A-SiN or the like that has a wider band gap than single crystal Si or single crystal GaAs, and there can be prepared graded band gap transistor or an improved graded band gap diode which are highly resistant against changes of temperature and high energy particles.

Accordingly, this invention provides an improved semiconductor device such as an improved graded band gap transistor and an improved graded band gap diode, comprising a non-single-crystal material containing silicon, band gap adjusting atom and a localized level reducing atoms and having a region in which a band gap is continuously graded at least one position other than junction position wherein only one of a conduction band and a valence band is continuously graded.

Thus, according to this invention, there can be a significant improvement in both the frequency characteristic and the photoresponse of a known non-single-crystal transistor or diode.

Moreover, the improved graded band gap transistor and diode according to this invention can be effectively mass-produced without depending upon the techniques employed for the preparation of GaAs (Al) series semiconductors.

In addition, according to this invention, it is possible to prepare a desired graded band gap transistor or diode based upon the application purpose since it allows various band gap widths and materials to be used.

Explanations will be made about the details of the improved semiconductor device according to this invention while referring to the drawings.

A typical graded band gap transistor according to this invention is shown in FIG. 1, in which are shown a substrate 101, a collector 102, a base 103 and an emitter 104 are disposed in this order on the substrate 101 wherein highly doped layers 105 are disposed on the collector 102 and another highly doped layer 106 is disposed on the emitter 104 in order to make an ohmic junction. To each of the doped layer 105, the base 103 and the doped layer 106, electric wires 107, 108 and 109 are electrically connected respectively.

Figure 2:
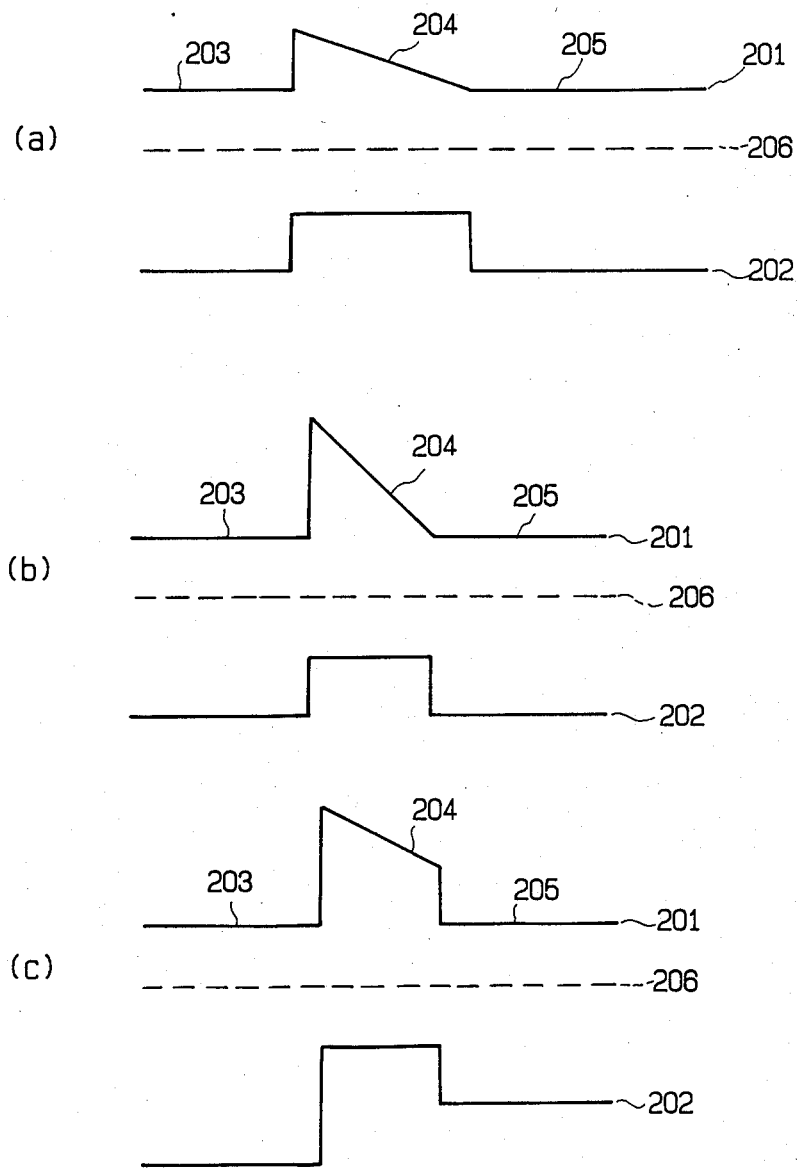
FIG. 2(a) through FIG. 2(c) are schematic explanatory views of the bands for graded band gap transistors prepared in Examples of this invention.

In FIGS. 2(a) through 2(c), there are schematically shown the band configurations in thermal equilibrium state of the graded band gap transistor according to this invention.

In FIGS. 2(a) through 2(c), numerals 203, 204 and 205 designate an emitter, base and collector respectively. Numeral 201 designate a conduction band, numeral 202 a valence band and numeral 206 a Fermi level.

It is desired for the band gap of the base 204 to be wider on the side of the emitter 203 and to be narrower on the side of the collector 205.

In the case where a discontinuity such as a notch or a spike occurs at the interface between the base 204 and the emitter 203 and also at the interface between the base 204 and the collector 205, it is desired to continuously distribute a common constituent element between the base 204 and the emitter 203 and also between the base 204 and the collector 205.

In order for the graded band gap transistor according to this invention to effectively exhibit its functions, it is desired that the difference between a minimum band gap and a maximum band gap in the base 204 be preferably more than 0.1 eV and most preferably, more than 0.2 eV.

Further, the thickness of the base is an important factor to decide the characteristics of the graded band gap transistor according to this invention. Though the thickness should be determined depending upon the kind of a material to be used, it is, however, preferably 2 $\mu$m or less, more preferably 1 $\mu$m or less, and most preferably, 0.7 $\mu$m or less.

In the semiconductor device of this invention, the band configurations in thermal equilibrium state of the graded band gap transistor are shown in FIGS. 2(a) through 2(c), wherein band configuration of a part of the semiconductor region (that is, the base region in the Figures) is in a state that the band gap grades in a tapered-like shape and in this graded region, only one band level of the valence band and the conduction band unifunctionally and continuously increases or decreases and the remaining band level stays in a flat state.

In general, the band gap can be made continuously graded by selecting suited film forming conditions and continuously changing the chemical composition ratios among the constituent elements in an objective semiconductor region.

However, as the prior art teaches, a semiconductor region having a band gap which is continuously graded may be obtained simply by continuously changing the foregoing chemical ratios. However, in that case, the band level of the valence band and that of the conduction band are graded at the same time and because of this, it becomes impossible to unifunctionally and continuously increase or decrease only one of the two band levels and to maintain the remaining band level in a flat state.

For instance, in the case where a part of the constituent semiconductor film for an objective semiconductor device is intended to be constituted with a non-single-crystal SiGe by means of plasma CVD, in general, its formation is carried out without changing the values for the film formation parameters therefor as much as possible in view of maintaining plasmas in a stable in a deposition chamber. Especially, the values for the parameters relating to the concentration of a diluted raw material gas and the like are not changed in this case.

Because of this, as the amount of Ge to be contained in a film increases, defects in the resulting film will increase such that, the resulting film is more likely to become n-type and at the same time, both the band level of a valence band and that of a conduction band will be changed accordingly.

On the other hand, in this invention, for instance, where a non-single-crystal SiGe is used to constitute a semiconductor film for an objective semiconductor device, its formation is carried out by utilizing the factual phenomena (i) that germanium atom serves to change the band level of a valence band and that of a conduction band toward the Fermi level in the intrinsic band structure of a non-single-crystal Si semiconductor under properly selected film forming conditions and (ii) that hydrogen atom serves to change only the band level of a valence band but hardly that of a conduction band.

In order to effectively attain the objects of this invention, in the case of forming a non-single-crystal SiGe film using plasma CVD, for example, discharging power is properly reduced while increasing the flow rate of hydrogen gas ($H_2$) as a dilution gas along with increasing the flow rate of a germanium introducing raw material gas. In this way, it is possible to continuously raise the band level of a conduction band starting from a certain position toward another direction against the Fermi level in an equilibrium state while maintaining the band level of a valence band in a flat state.

That is, in this invention, by using properly selected film forming conditions, there can be formed a desired semiconductor film which partially contains a region where a hole activating energy is maintained constant and an electron activating energy becomes increasingly large from one side toward another side in the band configuration.

Details of the above will be described in Examples of this invention.

Confirmation of whether or not the band configuration of said partial region of a semiconductor film constituting the semiconductor device according to this invention is in a desired state can be determined in accordance with a conventional band gap measuring method as follows.

(1) Measurement of Internal Photomission

Figure 3:
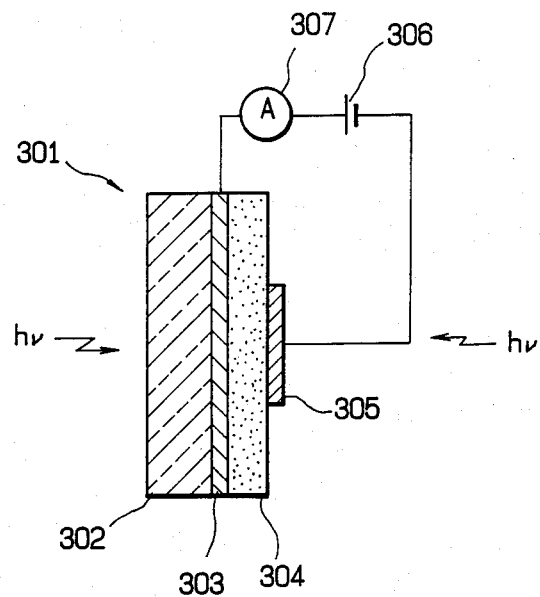
FIG. 3 is a schematic view illustrating a device for measuring an internal photomission and a V-I (voltage-electric current) property of a sample.

A sample and respective measuring devices are arranged so that an electric circuit can be made in the way as shown in FIG. 3.

In FIG. 3, numeral 301 stands for a sample.

As for the sample 301, a semiconductor film 304 of about 1 $\mu$m in thickness, for which a band configuration is to be measured, is disposed on a transluent chromium electrode disposed on a glass plate 302. On the reverse side of the semiconductor film 304, there is disposed another transluent chromium electrode 305.

The electrodes 303 and 305 are electrically connected to a direct current (DC) power source 306 and an ammeter in order to observe an electric current within the semiconductor film.

Using the above circuit, the wavelength dependency of a photoelectric current ($I_p$) can be observed by impressing a few voltages onto the sample 301.

The photoelectric current ($I_p$) to be measured can be expressed by the following equation (A):

$$I_p = e\eta N_o(1-R)[1-\exp(1-\alpha d)]\mu E \tau \quad (A)$$

e: elementary charge
$\eta$: quantum efficiency
d: semiconductor film thickness
$\mu$: mobility
$\tau$: life time
No: photon number/sec. of irradiated light
R: reflection factor on reflection plane
$\alpha$: absorption coefficient
E: electric field And, in the case of homogeneous absorption, the equation (A) becomes as follows:

$$I_p = e\eta N_o(1-R)(\alpha d)\mu E \tau \quad (B)$$

In this respect, the absorption coefficient ($\alpha$) can be expressed by the following equation (c):

$$\alpha \sim \frac{I_p}{N_o} \quad (C)$$

Utilizing this absorption coefficient, $h\nu$ is plotted to the abscissa and $\sqrt{2h\nu}$ is plotted to the ordinate to thereby obtain a band gap value for the semiconductor film 304.

In this case, respective band gap values of the wider side and the narrower side for the semiconductor film 304 can be independently measured by selectively using the glass plate 302 or the electrode 305 as the light incident side.

(2) Measurement of V-I (voltage-electric current characteristic

It can be observed that an electric barrier exists in which side of a valence band and a conduction band from the results of this measurement using the circuit shown in FIG. 3.

The V-I characteristic can be measured by irradiating light to the sample 301 while impressing a voltage thereonto.

From the resultant V-I curve obtained as a result of the measurement by impressing a voltage wherein the wider side of the band gap is made positive (+), it is graded in the side of a conduction band in the case where the impressed direction of said voltage has forward bias, and in the case where the above direction is observed to be reverse bias, in the side of a valence band.

In accordance with the results obtained in the foregoing measurements (1) and (2), it can be determined if the band configuration of a sample is equivalent to the defined band configuration of this invention.

Figure 4:
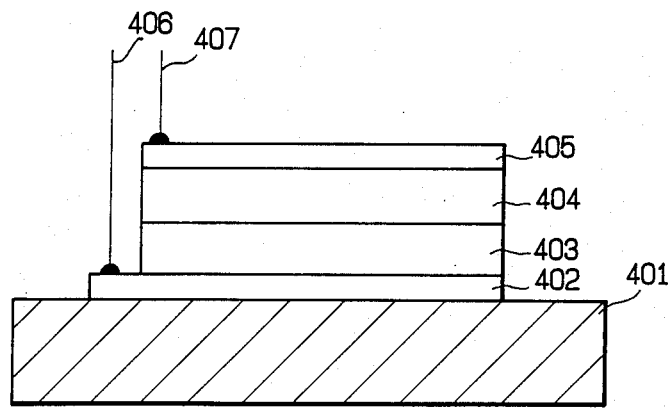
FIG. 4 is a schematic view illustrating a representative embodiment of a configuration for a graded band gap diode according to this invention.

Now, a typical graded band gap diode according to this invention is shown in FIG. 4, in which are shown a substrate 401, first ohmic contact layer 402, first non-single-crystal layer region 403, second non-single-crystal layer region 404 and second ohmic contact layer 405 disposed in this order.

The respective ohmic contact layers 402 and 405 contain a dopant in a large quantity of the same polarity as the adjacent layer regions 403 and 404 to thereby hold a respective ohmic contact. To each of the ohmic contact layers 402 and 405, electric wires 406 and 407 are respectively electrically connected.

Figure 5:
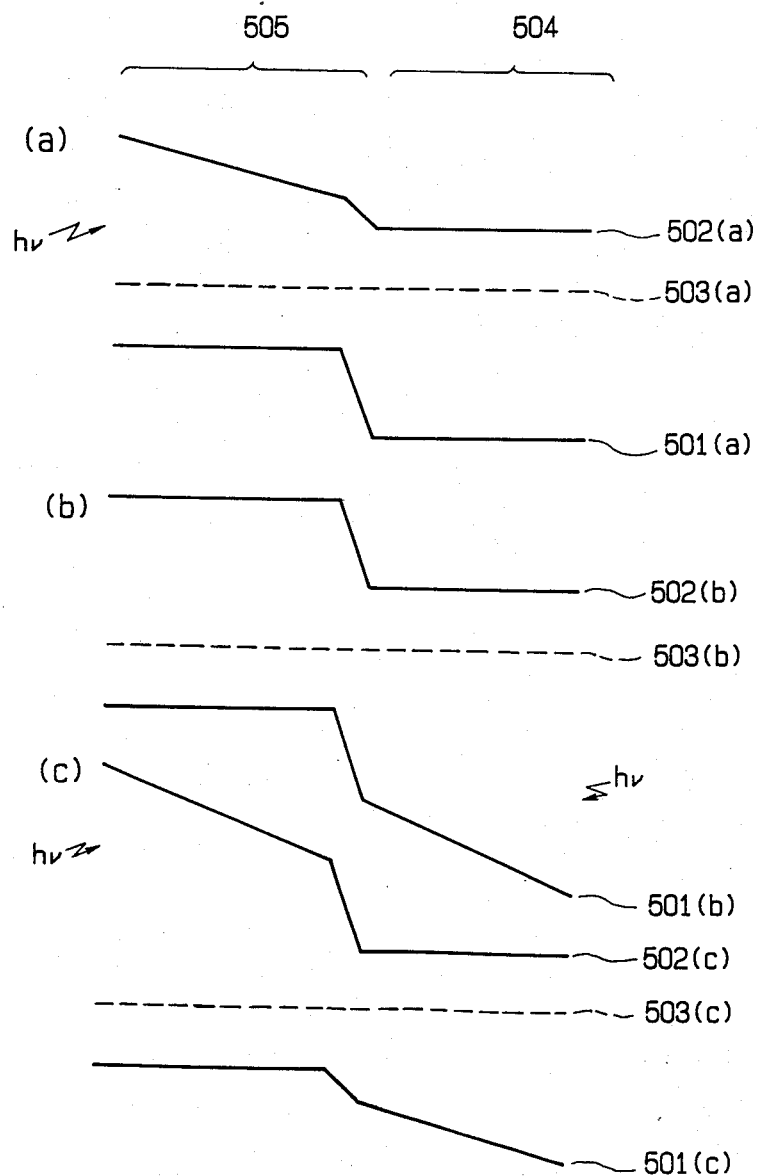
FIG. 5(a) through FIG. 5(c) and FIGS. 6(a) and (b) are schematic explanatory views of the bands for graded band gap diodes prepared in Examples of this invention.

In FIGS. 5(a) through 5(c), there are schematically shown the band configurations of the graded band gap diode in an equilibrium state according to this invention.

In FIGS. 5(a) through 5(c), numeral 504 stands for a first non-single-crystal region, and numeral 505 stands for a second non-single-crystal region. And, numerals 501(a) through 501(c), numerals 502(a) through 502(c), and numerals 503(a) through 503(c) stand for a valence band, a conduction band and a Fermi level respectively.

As shown in FIGS. 5(a) through 5(c), it is desired for the band gap to be such that is continuously graded in at least one of the first and second non-single-crystal layer regions, that only one of the valence band and the conduction band is continuously graded and the remaining one stays in a flat state and that the gap width becomes increasingly wider in the side adjacent to the electrode.

In case of using the graded band gap diode according to this invention as an photodiode, it is desired to thin the thickness of the ohmic contact layer as much as possible and to make the band gap in the light incident side wider as much as possible.

Further, it is possible to prevent occurrence of a notch or a spike at the interfaces of the first non-single-crystal layer region by continuously distributing the constituent elements therein.

In order for the graded band gap diode according to this invention to effectively exhibit its functions, it is desired for the difference between a minimum band gap and a maximum band gap to be preferably more than 0.1 eV and most preferably, more than 0.2 eV.

The layer thickness of a band gap grading region is an important factor to decide the characteristics of the graded band gap diode according to this invention.

Though said thickness should be determined properly depending upon the kind of a material to be used, it is desired to be rather thick in order to increase the breakdown voltage resistance against an impressed voltage and a preferable thickness in detail is in the range of 50 to 200 $\mu$m. On the other hand, in order to enhance the frequency response, it is desired to be rather thin and a preferable thickness in this case is in the range of 0.5 to 50 $\mu$m.

As for the usable raw material gas to supply silicon atoms forming the foregoing non-single-crystal film in this invention, there can be illustrated a chain silane compound such as $SiH_4$, $SiF_4$, $Si_2H_6$, $Si_2F_6$, $Si_3H_8$, $SiH_3F$, $Si_2H_2F$, etc. and a cyclic silane compound such as $Si_4H_8$, $Si_5H_{10}$, $Si_6H_{12}$, etc.

As for the raw material gas of imparting an atom for adjusting the band gap, that is, for widening or diminishing it, or for diminishing the localized level, there can be illustrated various compounds.

Specifically, usable as the raw material gas of imparting an atom to serve for widening the band gap are, for example, a carbon compound such as $CH_4$, $C_2H_2$, $C_2H_4$, $C_2H_6$, $Si(CH_3)_4$ and $SiH(CH_3)_3$; a nitrogen compound such as $N_2$, $NH_3$, $HN_3$, $H_2NNH_2$, $NH_4N_3$, $F_3N$ and $F_4N$; and an oxygen compound such as $O_2$, $O_3$, $CO_2$, $NO$, $NO_2$, $NO_3$, $N_2O$, $N_2O_3$ and $N_2O_4$.

Usable as the raw material gas of imparting an atom to serve for diminishing the band gap are, for example, a germanium containing compound such as $GeH_4$, $GeF_4$ and the like; and a tin containing compound such as $SnH_4$.

And, usable as the raw material gas of imparting an atom to serve for diminishing the localized level are, for example, hydrogen gas ($H_2$) and a halogen gas such as $F_2$, $Cl_2$, etc.

The use of such localized level diminishing atom is an important factor in order to effectively attain the objects of this invention.

And the amount of such localized level diminishing atom to be contained in a region where a band gap is to be graded is preferably 1 to 60 atomic %, more preferably 5 to 40 atomic %, and most preferably, 10 to 35 atomic %.

Further, in this invention, a dopant of group III or/and a dopant of group V of the Periodic Table is incorporated into a region where a band gap is to be graded for controlling the conductivity.

As the dopant of group III, there can be illustrated B, Al, Ga, In, Tl, etc. Among these elements, B and Ga are particularly preferred.

As the dopant of group V, there can be illustrated P, As, Sb, Bi, etc. Among these elements, P and Sb are particularly preferred.

In this invention, such dopant can be evenly or unevenly distributed in said region. The amount of such dopant to be contained in said region is preferably 5 atomic or less, more preferably 3 atomic % or less, and most preferably, 1 atomic % or less.

Explanation will now be made about a process for the preparation of a semiconductor device according to this invention and a fabrication apparatus for practicing said process.

Figure 7:
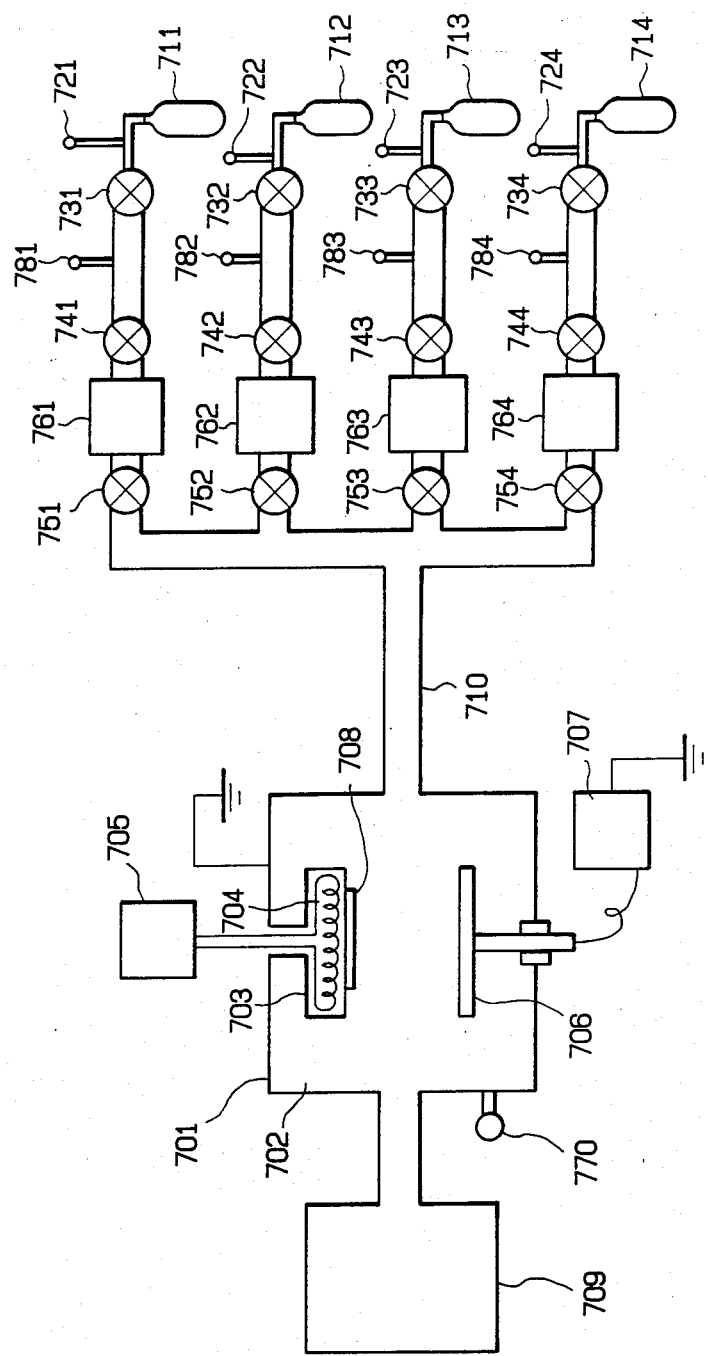
FIG. 7 is a schematic explanatory view of a fabrication apparatus as an example of the apparatus for preparing the graded band gap transistor or the diode according to this invention.

In FIG. 7, there is shown a representative fabrication apparatus suited for practicing a process for the preparation of semiconductor devices such as an improved graded band gap transistor and an improved graded band gap diode of this invention.

The fabrication apparatus shown in FIG. 7 is of a capacitive coupling type, and which comprises a deposition chamber 701 capable of being substantially enclosed which has a reaction space 702, an anode electrode 703, an electric heater 704 for heating a substrate 708, a control device 705 for the heater 704, a cathode electrode 706, a high frequency power source 707, an exhaust system 709, a vacuum gauge 770, a gas feed pipe 710, gas reservoirs 711 through 714, pressure gauges 721 through 724 and 781 through 784, primary valves 731 through 734, secondary valves 741 through 744, mass flow controllers 761 through 764, and valves 751 through 754.

Using this fabrication apparatus, for example, the graded band gap transistor of this invention may be prepared in the following way.

That is, firstly, the substrate 708 is firmly attached to the anode electrode 703 and the air in the deposition chamber 701 is evacuated to bring the reaction space 702 to about $1 \times 10^6$ Torr. Then, the control device 705 is switched on to heat the substrate 708 to a temperature of 50° C. to 600° C. After the substrate 708 became maintained at a predetermined temperature, collector forming raw material gases from the gas reservoirs are introduced through the mass flow controllers into the reaction space 702 at predetermined flow rates. Then, upon observing by the vacuum gauge 770 that the inner pressure of the reaction space 702 became a predetermined vacuum of 0.01 to 10 Torr, the high frequency power source is switched on to supply a high frequency power of 0.01 W/cm$^2$ to 10 W/cm$^2$ into the reaction space 702. After causing glow discharging for a predetermined period of time, a collector region layer of 0.05 $\mu$m to 10 $\mu$m in thickness becomes deposited on the substrate 708. Thereafter, the air in the deposition chamber 701 is sufficiently evacuated and the temperature of the substrate 708 having the collector region layer thereon is cooled to room temperature. Then, the vacuum of the deposition chamber 701 is broken and the substrate 708 is taken out therefrom. It is then engaged in etching treatment to thereby size the collector region on the substrate 708 to a predetermined shape.

The substrate 708 thus treated is placed again in the deposition chamber 701 and the above film forming procedures are repeated to thereby deposit a base region layer of about 2 μm in thickness on the previously formed collector region. In this case, in order to deposit it while continuously grading its band gap, the film forming process is carried out by continuously decreasing or increasing the flow rate of a raw material gas to impart a band gap adjusting atom while properly changing the discharging power, the concentration of a dilution gas, and the substrate temperature depending upon the requirements therefor.

Thereafter, the substrate 708 having the base region layer on the previously formed collector region is taken out from the deposition chamber 701, and it is engaged in patterning treatment to thereby make it to be a predetermined pattern.

Successively, the substrate 708 thus treated is placed in the deposition chamber 701. The above film forming procedures are repeated to thereby deposit a emitter region layer on the previously formed base region. Thereafter, it is engaged in etching treatment in the same way as the collector region. In this way, there is prepared an desired graded band gap transistor.

The graded band gap diode according to this invention may be prepared also using the fabrication apparatus shown in FIG. 7.

That is, the substrate 708 is firmly attached o the anode electrode 703, and the air in the deposition chamber is evacuated to bring the reaction space 702 to about $1 \times 10^{-6}$ Torr. Then, the control device 705 is switched on to heat the substrate 708 to a temperature of 50° C. to 600° C. After the substrate 708 became maintained at a predetermined temperature, ohmic contact layer forming raw material gases from the gas reservoirs are introduced through the mass flow controllers into the reaction space 702 at predetermined flow rates. Then, upon observing by the vacuum gauge 770 that the inner pressure of the reaction space 702 became a predetermined vacuum of 0.01 to 10 Torr, the high frequency power source is switched on to supply a high frequency power of 0.01 W/cm$^2$ to 10 W/cm$^2$ into the reaction space 702. After causing glow discharging for a predetermined period of time, an ohmic contact layer of 0.01 to 1 μm in thickness becomes deposited on the substrate 708. Thereafter, the air in the deposition chamber 701 is sufficiently evacuated and the temperature of the substrate 708 having the ohmic contact layer thereon is cooled to room temperature. Then, the vacuum of the deposition chamber 701 is broken and the substrate 708 is taken out therefrom. It is then engaged in etching treatment to thereby size the ohmic contact layer on the substrate 708 to a predetermined shape. The substrate 708 thus treated is placed again in the deposition chamber 701 and the above film forming procedures are repeated to thereby deposit a first layer region then a second layer region respectively of less than 100 μm in thickness on the previously formed ohmic contact layer. In this case, in order to deposit each layer region while continuously grading its band gap, the film forming process is carried out by continuously decreasing or increasing the flow rate of a raw material gas to impart a band gap adjusting atom while properly changing the discharging power, the concentration of a dilution gas, and the substrate temperature depending upon the requirements therefor.

And, the substrate 708 having the first and second layer regions on the previously formed ohmic contact layer is taken out from the deposition chamber 701 in the same way as the above, then it is engaged in patterning treatment to make it to be a predetermined pattern. Finally, repeating the above film forming procedures, another desired ohmic contact layer is deposited on the previously formed second layer region. In this way, there is prepared an objective desired graded band gap diode.

Figure 8:
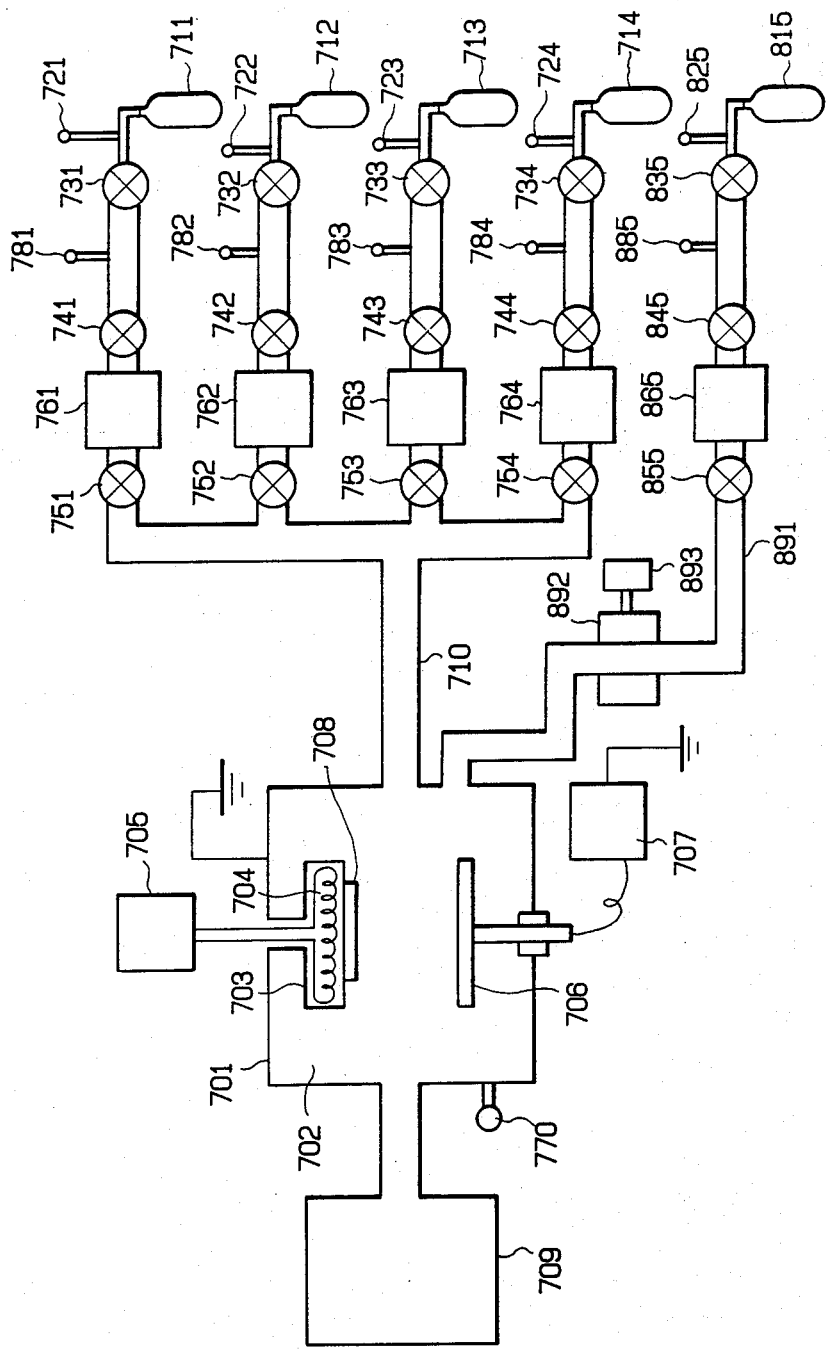
FIG. 8 is a schematic explanatory view of a fabrication apparatus as another example of the apparatus for preparing the graded band gap transistor or the diode according to this invention.

Now, there is shown another representative fabrication apparatus in FIG. 8.

The fabrication apparatus of FIG. 8 is a partial modification of the fabrication apparatus shown in FIG. 7, to which a gas supplying system of hydrogen radical being added, which comprises a hydrogen gas reservoir 815, pressure gauges 825 and 885, a primary valve 835, a secondary valve 845, a mass flow controller 865, valve 854, a hydrogen gas feed pipe 891, a activation chamber 892 and a microwave power source 893.

The semiconductor devices such as an improved graded band gap transistor and an improved graded band gap diode according to this invention may be effectively prepared also using the fabrication apparatus shown in FIG. 8.

PREFERRED EMBODIMENT OF THE INVENTION

The advantages of this invention are now described in more detail by reference to the following Examples, which are provided merely for illustrative purposes only, and are not intended to limit the scope of this invention.

EXAMPLE 1

Using the apparatus shown in FIG. 7, there was prepared a graded band gap transistor of the type shown in FIG. 1 and which has the band configuration shown in FIG. 2(a).

As the substrate 101, there was used a Corning's glass plate 7059 (product of Corning Glass Works), and the formation of each constituent layer was carried out under the conditions shown in Table 1.

As a result of examining the chemical composition of each constituent layer for the resultant transistor using RHEED, it was found that every constituent layer is composed of a silicon containing amorphous material.

In addition, as a result of measuring the amount of germanium atom in the base using SIMS, it was found that the germanium atom is contained therein in a state that its concentration is being continuously varied from 0 atomic % to 30 atomic %.

Further, it was found that the band gap for the amorphous layer region not containing germanium atom is 1.7 eV and that for the amorphous layer region containing 30 atomic % of germanium atom is 1.45 eV.

Further in addition, for the frequency characteristic of the resultant transistor, it was found that it is improved by about 1.7 folds over that of the transistor prepared in Comparative Example 1, which will be below described.

EXAMPLE 2

Using the apparatus shown in FIG. 7, there was prepared a graded band gap transistor of the type shown in FIG. 1 and which has the band configuration shown in FIG. 2(b).

As the substrate 101, there was used a Corning's glass plate 7059 (product of Corning Glass Works), and the formation of each constituent layer was carried out under the conditions shown in Table 2.

As a result of examining the chemical composition of each constituent layer for the resultant transistor using RHEED, it was found that every constituent layer is composed of a silicon containing amorphous material.

In addition, as a result of measuring the amount of carbon atom in the base using SIMS, it was found that the carbon atom is contained therein in a state that its concentration is being continuously varied from 20 atomic % to 0 atomic %.

Further, it was found that the band gap for the amorphous layer region containing 20 atomic % of carbon atom is 2.0 eV.

Further in addition, for the frequency characteristic of the resultant transistor, it was found that it is improved by about 1.5 folds over that of the transistor prepared in Comparative Example 1, which will be below described.

EXAMPLE 3

Using the apparatus shown in FIG. 7, there was prepared a graded band gap transistor of the type shown in FIG. 1 and which has the band configuration shown in FIG. 2(c).

As the substrate 101, there was used a Corning's glass plate 7059 (product of Corning Glass Works), and the formation of each constituent layer was carried out under the conditions shown in Table 3.

As a result of examining the chemical composition of each constituent layer for the resultant transistor using RHEED, it was found that every constituent layer is composed of a silicon containing amorphous material.

In addition, as a result of measuring the amount of carbon atom in the base using SIMS, it was found that the carbon atom is contained therein in a state that its concentration is being continuously varied from 30 atomic % to 0 atomic %.

Further, it was found that the band gap of the amorphous layer containing carbon atom is 2.2 eV for its widest part.

Further in addition, for the S/N ratio of the response against visible light of the resultant transistor, it was found that it is improved by about 2 folds over that of the transistor prepared in Comparative Example 1, which will be below described.

COMPARATIVE EXAMPLE 1

There was prepared a transistor of the type shown in FIG. 1 under the conditions shown in Table 4 using the apparatus of FIG. 7, wherein a Corning's glass plate 7059 (product of Corning Glass Works) was used as the substrate 101.

EXAMPLE 4

Using the apparatus shown in FIG. 7, there was prepared a graded band gap diode of the type shown in FIG. 4 and which has the band configuration shown in FIG. 5(a).

As the substrate 101, there was used a Corning's glass plate 7059 (product of Corning Glass Works), and the formation of each constituent layer was carried out under the conditions shown in Table 5.

As a result of examining the chemical composition of each constituent layer for the resultant diode using RHEED, it was found that every constituent layer is composed of a silicon containing amorphous material.

In addition, as a result of measuring the amount of germanium atom in the second layer region using SIMS, it was found that the germanium atom is contained therein in a state that its concentration is being continuously varied from 0 atomic % to 30 atomic %.

Further, it was found that the band gap for the amorphous layer region not containing germanium atom is 1.7 eV and that for the amorphous layer region containing 30 atomic % of germanium atom is 1.45 eV.

Further in addition, for the switching period of the resultant diode, it was found that it is improved by about 1.6 folds over those of the two kinds of diode prepared in Comparative Example 2, which will be below described.

COMPARATIVE EXAMPLE 2

The procedures of Example 4 were repeated, except that the flow rate of GeF$_4$ maintained constant at 0.10 SCCM at the time of forming the second layer region, to thereby obtain two kinds of diode.

EXAMPLE 5

Using the apparatus shown in FIG. 7, there was prepared a graded band gap diode of the type shown in FIG. 4 and which has the band configuration shown in FIG. 5(b).

As the substrate 101, there was used a Corning's glass plate 7059 (product of Corning Glass Works), and the formation of each constituent layer was carried out under the conditions shown in Table 6.

As a result of examining the chemical composition of each constituent layer for the resultant diode using RHEED, it was found that every constituent layer is composed of a silicon containing amorphous material.

In addition, as a result of measuring the amount of carbon atom in the first layer region using SIMS, it was found that the carbon atom is contained therein in a state that its concentration is being continuously varied from 20 atomic % to 0 atomic %.

Further, it was found that the band gap for the amorphous layer region containing 20 atomic % of carbon atom is 2.0 eV.

Further in addition, for the S/N ration of the resultant diode, it was found that it is improved by about 1.5 folds over that of a diode prepared in Comparative Example 3, which will be below described.

COMPARATIVE EXAMPLE 3

The procedures of Example 5 were repeated, except that the discharging power maintained constant at 0.50 W/cm$^2$, to thereby obtain two kinds of diode.

EXAMPLE 6

Using the apparatus shown in FIG. 7, there was prepared a graded band gap diode of the type shown in FIG. 4 and which has the band configuration shown in FIG. 5(c).

As the substrate 101, there was used a Corning's glass plate 7059 (product of Corning Glass Works), and the formation of each constituent layer was carried out under the conditions shown in Table 7.

As a result of examining the chemical composition of each constituent layer for the resultant diode using RHEED, it was found that every constituent layer is composed of a silicon containing amorphous material.

In addition, as a result of measuring the amount of nitrogen atom in the second layer region using SIMS, it was found that the nitrogen atom is contained therein in a state that its concentration is being continuously varied from 30 atomic % to 0 atomic %.

Further, it was found that the band gap for the second layer region is 2.2 eV for its widest part.

Further in addition, for the S/N ratio of the resultant diode, it was found that it is improved by about 2.1 folds over that of the diode obtained in Comparative Example 2.

EXAMPLE 7

Figure 6:
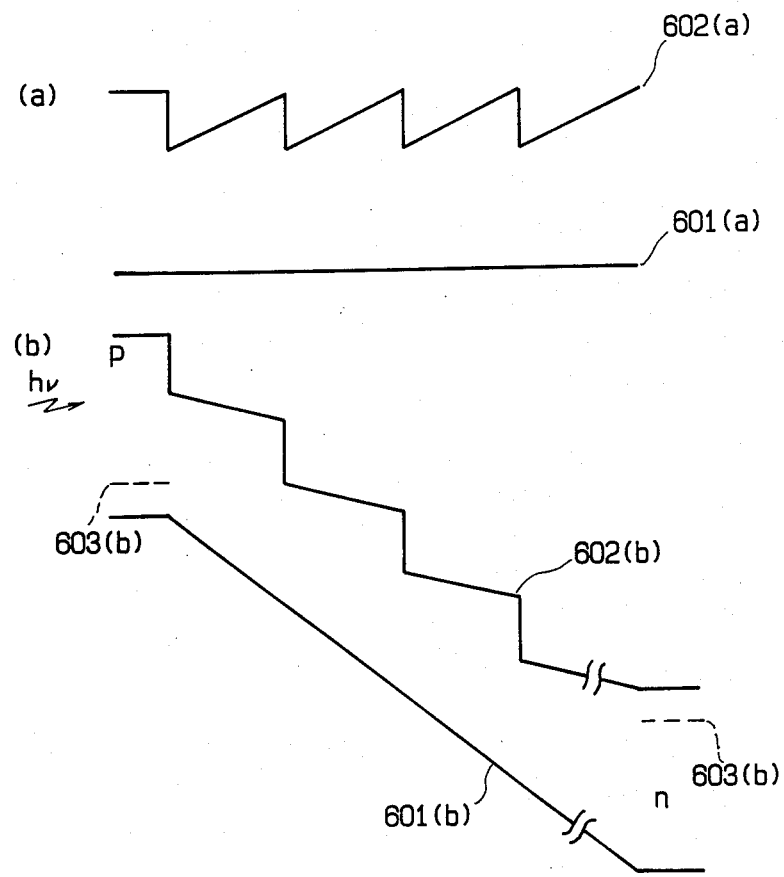

Using the apparatus of FIG. 7, there was prepared an improved avalanche diode having the band configurations shown in FIGS. 6(a) and 6(b) under the conditions shown in Table 8. In FIGS. 6(a) and 6(b), there are shown a conduction band 601(a), 601(b), a valence band 602(a), 602(b) and a Fermi level 603(b). And FIG. 6(a) shows the band configuration in the case where a voltage is not impressed and FIG. 6(b) shows the band configuration in the case where a voltage is impressed.

There was used a Corning's glass plate 7059 (product of Corning Glass Works) as the substrate therefor.

As a result of examining the chemical composition of each constituent layer for the resultant avalanche diode using RHEED, it was found that every constituent layer is composed of a silicon containing amorphous material.

And, for the S/N ratio of the response against visible light for the resultant avalanche diode, it was found that it is improved by about 2 folds over that for a photodiode prepared without using $GeF_4$ for the formation of an i-type layer.

EXAMPLE 8

Using the apparatus shown in FIG. 8, there was prepared a graded band gap diode of the type shown in FIG. 4 and which has the band configuration shown in FIG. 5(a) under the conditions shown in Table 9, wherein a Corning's glass plate 7059 (product of Corning Glass Works) was used as the substrate 101.

And, at the time when the second layer region (graded band gap layer) was formed, hydrogen gas ($H_2$) from the hydrogen gas reservoir 815 was introduced into the activation chamber 892 and at the same time, a microwave power energy of 100 W/cm$^2$ from the microwave power source 893 was applied thereto to thereby generate hydrogen radicals, which were successively introduced into the reaction space 702 at a flow rate of 20 SCCM.

As a result of examining the chemical composition of each constituent layer for the resultant diode using RHEED, it was found that every constituent layer is composed of a silicon containing amorphous material.

In addition, as a result of examining the amount of germanium atom in the second layer region using SIMS, it was found that the germanium atom is contained therein in a state that its concentration is being continuously varied from 0 atomic % to 30 atomic %.

Further, it was found that the band gap for the amorphous layer region not containing germanium atom is 1.7 eV and that for the amorphous layer region containing 30 atomic % of germanium atom is 1.45 eV.

Other than the above, there was prepared a device comprising a glass plate, a translucent chromium electrode, an amorphous semiconductor film (0.5 μm in thickness) and a translucent chromium electrode. As for the amorphous semiconductor film, it was formed by repeating the procedures for forming the foregoing second layer region. A photoelectromotive force was examined on the resultant device using AMI light source. As a result, it was found that it was obtained as 0.25 V.

From the above measurement results of the band gap and of the photoelectromotive force, it can be estimated that only the conduction band is being graded against the Fermi level in the foregoing second layer region.

For the switching period for the above resultant diode, it was found that it is improved by about 1.6 folds over that for a diode prepared in the following Comparative Example 4.

COMPARATIVE EXAMPLE 4

The procedures of Example 8 were repeated, except that any hydrogen radical was not used and the discharging power maintained constant at 0.5 W/cm$^2$ at the time of forming the second layer region, to thereby obtain a diode as a comparative sample.

As for the band gap of the second layer region for the resultant sample, it was found that it is 1.7 eV for the amorphous layer region not containing germanium atom and that it is 1.45 eV for the amorphous layer region containing germanium atom.

Repeating the procedures of Example 8, there was prepared a sample device for the measurement of a photoelectromotive force which has the second layer region of the above comparative sample as the semiconductor film therefor.

As a result of examining a photoelectromotive force on the resultant sample device, it was obtained as 0.1 V.

From the above measurement results, it can be estimated that both the conduction band and the valence band are graded in the second layer region of the comparative sample.

EXAMPLE 9

Using the apparatus shown in FIG. 8, there was prepared a graded band gap diode of the type shown in FIG. 4 and which has the band configuration shown in FIG. 5(b) under the condition shown in Table 10, wherein a Corning's glass plate 7059 (product of Corning Glass Works) was used as the substrate 101.

And, at the time when the second layer region (graded band gap layer) was formed, hydrogen gas ($H_2$) from the hydrogen gas reservoir 815 was introduced into the activation chamber 892 and at the same time, a microwave power energy of 100 W/cm$^2$ from the microwave power source 893 was applied thereto to thereby generate hydrogen radicals, which were successively introduced into the reaction space 702 at a flow rate of 50 SCCM.

As a result of examining the chemical composition of each constituent layer for the resultant diode using RHEED, it was found that every constituent layer is composed of a silicon containing amorphous material.

In addition, as a result of examining the amount of carbon atom in the second layer region using SIMS, it was found that the carbon atom is contained therein in a state that its concentration is being continuously varied from 20 atomic % to 0 atomic %.

Further, it was found that the band gap for the amorphous layer region containing carbon atom is 2.0 eV.

Other than the above, there was prepared a device comprising a glass plate, a translucent chromium electrode, an amorphous semiconductor film (0.5 μm in thickness) and a translucent chromium electrode. As for the amorphous semiconductor film, it was found by repeating the procedures for forming the foregoing second layer region. A photoelectromotive force was examined on the resultant device using AMI light source. As a result, it was found that it was obtained as 0.3 V.

From the above measurement results of the band gap and of the photoelectromotive force, it can be estimated that only the conduction band is being graded against the Fermi level in the foregoing second layer region.

For the S/N ratio for the above resultant diode, it was found that it is improved by about 1.5 folds over that for a diode prepared in the following Comparative Example 5.

COMPARATIVE EXAMPLE 5

The procedures of Example 9 were repeated, except that any hydrogen radical was not used and the discharging power maintained constant at 0.5 W/cm$^2$ at the time of forming the second layer region, to thereby obtain a diode as a comparative sample.

As for the band gap of the second layer region for the resultant sample, it was found that it is 1.7 eV for the amorphous layer region not containing carbon atom and that it is 1.45 eV for the amorphous layer region containing carbon atom.

Repeating the procedures of Example 9, there was prepared a sample device for the measurement of a photoelectromotive force which has the second layer region of the above comparative sample as the semiconductor film therefor.

As a result of examining a photoelectromotive force on the resultant sample device, it was obtained as 0.12 V.

From the above measurement results, it can be estimated that both the conduction band and the valence band are graded in the second layer region of the comparative sample.

EXAMPLE 10

Using the apparatus shown in FIG. 8, there was prepared a graded band gap diode of the type shown in FIG. 4 and which has the band configuration shown in FIG. 5(c) under the conditions shown in Table 11, wherein a Corning's glass plate 7059 (product of Corning Glass Works) was used as the substrate 101.

And, at the time when the second layer region (graded band gap layer) was formed, hydrogen gas (H$_2$) from the hydrogen gas reservoir 815 was introduced into the activation chamber 892 and at the same time, a microwave power energy of 100 W/cm$^2$ from the microwave power source 893 was applied thereto to thereby generate hydrogen radicals, which were successively introduced into the reaction space 702 at a flow rate of 50 SCCM.

As a result of examining the chemical composition of each constituent layer for the resultant diode using RHEED, it was found that every constituent layer is composed of a silicon containing amorphous material.

In addition, as a result of examining the amount of nitrogen atom in the second layer region using SIMS, it was found that the nitrogen is contained therein in a state that its concentration is being continuously varied from 30 atomic % to 0 atomic %.

Further, it was found that the band gap for the second layer region is 2.2 eV for its widest part.

Other than the above, there was prepared a device comprising a glass plate, a translucent chromium electrode, an amorphous semiconductor film (0.5 μm in thickness) and a translucent chromium electrode. As for the amorphous semiconductor film, it was formed by repeating the procedures for forming the foregoing second layer region. A photoelectromotive force was examined on the resultant device using AMI light source. As a result, it was found that it was obtained as 0.32 V.

From the above measurement results of the band gap and of the photoelectromotive force, it can be estimated that only the conduction band is graded against the Fermi level in the foregoing second layer region.

For the S/N ratio for the above resultant diode, it was found that it is improved by about 2.1 folds over that for the diode obtained in Comparative Example 4.

EXAMPLE 11

Using the apparatus shown in FIG. 8, there was prepared an avalanche diode which has the band configuration shown in FIG. 6(a), wherein a Corning's glass plate 7059 (product of Corning Glass Works) was used as the substrate.

And, at the time when the second layer region (graded band gap layer) was formed, hydrogen gas (H$_2$) from the hydrogen gas reservoir 815 was introduced into the activation chamber 892 and at the same time, a microwave power energy of 100 W/cm$^2$ from the microwave power source 893 was applied thereto to thereby generate hydrogen radicals, which were successively introduced into the reaction space 702 at a flow rate of 50 SCCM.

As a result of examining the chemical composition of each constituent layer for the resultant avalanche diode using RHEED, it was found that every constituent layer is composed of a silicon containing amorphous material.

Further, for the S/N ratio of the response against visible light for the resultant diode, it was found that it is improved by about 2 folds over a diode prepared without using GeF$_4$ gas for the formation of an i-type layer.

TABLE 1

| name of layer | gas used & its flow rate (SCCM) | inner pressure (Torr) | discharging power (W/cm$^2$) | substrate temperature (°C.) | deposition rate (Å/sec) | thickness (μm) |
|---|---|---|---|---|---|---|
| first layer (collector) | SiH$_4$ = 30<br>H$_2$ = 30 | 0.2 | 0.5 | 290 | 3.0 | 2.0 |
| second layer (base) | SiH$_4$ = 30<br>B$_2$H$_6$/H$_2$ = 30<br>(H$_2$ base 300 ppm)<br>GeF$_4$ = 0 → 1.0<br>H$_2$ = 0 → 200 | 0.2 | 0.5 → 0.1 | 290 | 3.0 | 0.4 |
| third layer | SiH$_4$ = 30 | | | | | |

TABLE 1-continued

| name of layer | gas used & its flow rate (SCCM) | inner pressure (Torr) | discharging power (W/cm$^2$) | substrate temperature (°C.) | deposition rate (Å/sec) | thickness (μm) |
|---|---|---|---|---|---|---|
| (emitter) | PH$_3$/H$_2$ = 30 (H$_2$ base 500 ppm) | 0.2 | 0.5 | 290 | 3.0 | 1.0 |
| ohmic layer (on the collector) | SiH$_4$ = 30 PH$_3$/H$_2$ = 60 (H$_2$ base 500 ppm) | 0.2 | 0.5 | 290 | 3.0 | 0.05 |
| ohmic layer (on the emitter) | SiH$_4$ = 30 PH$_3$/H$_2$ = 60 (H$_2$ base 500 ppm) | 0.2 | 0.5 | 290 | 3.0 | 0.05 |

TABLE 2

| name of layer | gas used & its flow rate (SCCM) | inner pressure (Torr) | discharging power (W/cm$^2$) | substrate temperature (°C.) | deposition rate (Å/sec) | thickness (μm) |
|---|---|---|---|---|---|---|
| first layer (collector) | SiH$_4$ = 30 H$_2$ = 30 | 0.3 | 0.2 | 300 | 1.8 | 2.5 |
| second layer (base) | SiH$_4$ = 30 B$_2$H$_6$/H$_2$ = 30 (H$_2$ base 300 ppm) CH$_4$ = 50 → 0 H$_2$ = 200 → 0 | 0.3 | 0.2 → 0.1 | 300 | 1.8 | 0.4 |
| third layer (emitter) | SiH$_4$ = 30 PH$_3$/H$_2$ = 30 (H$_2$ base 500 ppm) | 0.3 | 0.2 | 300 | 1.8 | 1.0 |
| ohmic layer (on the collector) | SiH$_4$ = 30 PH$_3$/H$_2$ = 60 (H$_2$ base 500 ppm) | 0.3 | 0.2 | 300 | 1.8 | 0.05 |
| ohmic layer (on the emitter) | SiH$_4$ = 30 PH$_3$/H$_2$ = 60 (H$_2$ base 500 ppm) | 0.3 | 0.2 | 300 | 1.8 | 0.05 |

TABLE 3

| name of layer | gas used & its flow rate (SCCM) | inner pressure (Torr) | discharging power (W/cm$^2$) | substrate temperature (°C.) | deposition rate (Å/sec) | thickness (μm) |
|---|---|---|---|---|---|---|
| first layer (collector) | SiH$_4$ = 20 | 0.3 | 0.5 | 250 | 1.8 | 2.5 |
| second layer (base) | SiH$_4$ = 20 NH$_3$ = 30 → 0 H$_2$ = 200 → 0 B$_2$H$_6$/H$_2$ = 30 (H$_2$ base 1000 ppm) | 0.3 | 0.5 → 0.1 | 250 | 1.8 | 0.4 |
| third layer (emitter) | SiH$_4$ = 30 PH$_3$/H$_2$ = 30 (H$_2$ base 1000 ppm) NH$_3$ = 30 | 0.3 | 0.5 | 250 | 3.0 | 1.8 |
| ohmic layer (on the collector) | SiH$_4$ = 30 PH$_3$/H$_2$ = 60 (H$_2$ base 700 ppm) | 0.3 | 0.2 | 250 | 1.8 | 0.05 |
| ohmic layer (on the emitter) | SiH$_4$ = 30 PH$_3$/H$_2$ = 60 (H$_2$ base 500 ppm) NH$_3$ = 30 | 0.3 | 0.2 | 250 | 1.8 | 0.05 |

TABLE 4

| name of layer | gas used & its flow rate (SCCM) | inner pressure (Torr) | discharging power (W/cm$^2$) | substrate temperature (°C.) | deposition rate (Å/sec) | thickness (μm) |
|---|---|---|---|---|---|---|
| first layer (collector) | SiH$_4$ = 30 H$_2$ = 30 | 0.2 | 0.5 | 290 | 3.0 | 2.0 |
| second layer (base) | SiH$_4$ = 30 B$_2$H$_6$/H$_2$ = 30 (H$_2$ base 300 ppm) | 0.2 | 0.5 | 290 | 3.0 | 0.4 |
| third layer (emitter) | SiH$_4$ = 30 PH$_3$/H$_2$ = 60 (H$_2$ base 500 ppm) | 0.2 | 0.5 | 290 | 3.0 | 1.0 |
| ohmic layer (on the collector) | SiH$_4$ = 30 PH$_3$/H$_2$ = 60 (H$_2$ base 500 ppm) | 0.2 | 0.5 | 290 | 3.0 | 0.05 |
| ohmic layer (on the | SiH$_4$ = 30 PH$_3$/H$_2$ = 60 | 0.2 | 0.5 | 290 | 3.0 | 0.05 |

TABLE 4-continued

| name of layer | gas used & its flow rate (SCCM) | | inner pressure (Torr) | discharging power (W/cm$^2$) | substrate temperature (°C.) | deposition rate (Å/sec) | thickness (μm) |
|---|---|---|---|---|---|---|---|
| emitter) | (H$_2$ base 500 ppm) | | | | | | |

TABLE 5

| name of layer | gas used & its flow rate (SCCM) | | inner pressure (Torr) | discharging power (W/cm$^2$) | substrate temperature (°C.) | thickness (μm) |
|---|---|---|---|---|---|---|
| ohmic contact layer | SiH$_4$<br>PH$_3$/H$_2$<br>(500 ppm) | 30<br>60 | 0.3 | 0.5 | 290 | 0.05 |
| first layer region | SiH$_4$<br>PH$_3$/H$_2$<br>(500 ppm) | 30<br>30 | 0.3 | 0.5 | 290 | 0.3 |
| * second layer region | SiH$_4$<br>B$_2$H$_6$/H$_2$<br>(300 ppm)<br>GeF$_4$<br>H$_2$ | 30<br>30<br>1 → 0<br>0 → 300 | 0.3 | 0.1 → 0.75 | 290 | 0.5 |
| ohmic contact layer | SiH$_4$<br>B$_2$H$_6$/H$_2$<br>(300 ppm) | 30<br>60 | 0.3 | 0.5 | 290 | 0.05 |

*: graded band gap layer

TABLE 6

| name of layer | gas used & its flow rate (SCCM) | | inner pressure (Torr) | discharging power (W/cm$^2$) | Substrate temperature (°C.) | thickness (μm) |
|---|---|---|---|---|---|---|
| ohmic contact layer | SiH$_4$<br>PH$_3$/H$_2$<br>(500 ppm) | 30<br>60 | 0.3 | 0.5 | 290 | 0.05 |
| * first layer region | SiH$_4$<br>PH$_3$/H$_2$<br>(500 ppm)<br>CH$_4$<br>H$_2$ | 30<br>30<br>50 → 0<br>300 → 0 | 0.3 | 0.75 → 0.1 | 290 | 0.3 |
| second layer region | SiH$_4$<br>B$_2$H$_6$/H$_2$<br>(300 ppm) | 30<br>30 | 0.3 | 0.1 → 0.75 | 290 | 0.5 |
| ohmic contact layer | SiH$_4$<br>B$_2$H$_6$/H$_2$<br>(300 ppm) | 30<br>60 | 0.3 | 0.5 | 290 | 0.05 |

*: graded band gap layer

TABLE 7

| name of layer | gas used & its flow rate (SCCM) | | inner pressure (Torr) | discharging power (W/cm$^2$) | substrate temperature (°C.) | thickness (μm) |
|---|---|---|---|---|---|---|
| ohmic contact layer | SiH$_4$<br>PH$_3$/H$_2$<br>(500 ppm) | 30<br>60 | 0.3 | 0.5 | 290 | 0.05 |
| * first layer region | SiH$_4$<br>PH$_3$/H$_2$<br>(500 ppm)<br>GeF$_4$<br>H$_2$ | 30<br>30<br>0 → 1<br>0 → 300 | 0.3 | 0.75 → 0.1 | 290 | 0.3 |
| ** second layer region | SiH$_4$<br>B$_2$H$_6$/H$_2$<br>(300 ppm)<br>NH$_3$<br>H$_2$ | 30<br>30<br>0 → 30<br>0 → 300 | 0.3 | 0.1 → 0.75 | 290 | 0.5 |
| ohmic contact layer | SiH$_4$<br>B$_2$H$_6$/H$_2$<br>(300 ppm) | 30<br>60 | 0.3 | 0.5 | 290 | 0.05 |

*,**: graded band gap layer

TABLE 8

| name of layer | gas used & its flow rate (SCCM) | | inner pressure (Torr) | discharging power (W/cm$^2$) | substate temperature (°C.) | thickness (μm) |
|---|---|---|---|---|---|---|
| ohmic contact layer (p-type layer) | SiH$_4$<br>PH$_3$/H$_2$<br>(500 ppm) | 30<br>60 | 0.3 | 0.5 | 290 | 0.05 |

TABLE 8-continued

| name of layer | gas used & its flow rate (SCCM) | | inner pressure (Torr) | discharging power (W/cm$^2$) | substrate temperature (°C.) | thickness (μm) |
|---|---|---|---|---|---|---|
| graded band gap layer (i-type layer) | SiH$_4$<br>H$_2$<br>GeF$_4$ | 30<br>300 → 0<br>1 → 0 | 0.3 | 0.1 → 0.75 | 290 | **<br>0.1 * 10 = 1 |
| ohmic contact layer (n-type layer) | SiH$_4$<br>B$_2$H$_6$/H$_2$<br>(300 ppm) | 30<br>60 | 0.3 | 0.5 | 290 | 0.05 |

**: 10 layers laminated

TABLE 9

| name of layer | gas used & its flow rate (SCCM) | | inner pressure (Torr) | discharging power (W/cm$^2$) | substrate temperature (°C.) | thickness (μm) |
|---|---|---|---|---|---|---|
| ohmic contact layer | SiH$_4$<br>PH$_3$/H$_2$<br>(500 ppm) | 30<br>60 | 0.3 | 0.5 | 290 | 0.05 |
| first layer region | SiH$_4$<br>PH$_3$/H$_2$<br>(500 ppm) | 30<br>30 | 0.3 | 0.5 | 290 | 0.3 |
| * second layer region | SiH$_4$<br>B$_2$H$_6$/H$_2$<br>(300 ppm)<br>GeF$_4$<br>H$_2$ | 30<br>30<br><br>1 → 0<br>0 → 200 | 0.3 | 0.1 → 0.5 | 290 | 0.5 |
| ohmic contact layer | SiH$_4$<br>B$_2$H$_6$/H$_2$<br>(300 ppm) | 30<br>60 | 0.3 | 0.5 | 290 | 0.05 |

*: graded band gap layer

TABLE 10

| name of layer | gas used & its flow rate (SCCM) | | inner pressure (Torr) | discharging power (W/cm$^2$) | substrate temperature (°C.) | thickness (μm) |
|---|---|---|---|---|---|---|
| ohmic contact layer | SiH$_4$<br>PH$_3$/H$_2$<br>(500 ppm) | 30<br>60 | 0.3 | 0.5 | 290 | 0.05 |
| * first layer region | SiH$_4$<br>PH$_3$/H$_2$<br>(500 ppm)<br>CH$_4$<br>H$_2$ | 30<br>30<br><br>50 → 0<br>200 → 0 | 0.3 | 0.5 → 0.1 | 290 | 0.3 |
| second layer region | SiH$_4$<br>B$_2$H$_6$/H$_2$<br>(300 ppm) | 30<br>30 | 0.3 | 0.5 | 290 | 0.5 |
| ohmic contact layer | SiH$_4$<br>B$_2$H$_6$/H$_2$<br>(300 ppm) | 30<br>60 | 0.3 | 0.5 | 290 | 0.05 |

*: graded band gap layer

TABLE 11

| name of layer | gas used & its flow rate (SCCM) | | inner pressure (Torr) | discharging power (W/cm$^2$) | substrate temperature (°C.) | thickness (μm) |
|---|---|---|---|---|---|---|
| ohmic contact layer | SiH$_4$<br>PH$_3$/H$_2$<br>(500 ppm) | 30<br>60 | 0.3 | 0.5 | 290 | 0.05 |
| * first layer region | SiH$_4$<br>PH$_3$/H$_2$<br>(500 ppm)<br>GeF$_4$<br>H$_2$ | 30<br>30<br><br>0 → 1<br>0 → 200 | 0.3 | 0.5 → 0.1 | 290 | 0.3 |
| ** second layer region | SiH$_4$<br>B$_2$H$_6$/H$_2$<br>(300 ppm)<br>NH$_3$<br>H$_2$ | 30<br>30<br><br>0 → 30<br>0 → 200 | 0.3 | 0.1 → 0.5 | 290 | 0.5 |
| ohmic contact layer | SiH$_4$<br>B$_2$H$_6$/H$_2$<br>(300 ppm) | 30<br>60 | 0.3 | 0.5 | 290 | 0.05 |

*,**: graded band gap layer

TABLE 12

| name of layer | gas used & its flow rate (SCCM) | | inner pressure (Torr) | discharging power (W/cm$^2$) | substrate temperature (°C.) | thickness (μm) |
|---|---|---|---|---|---|---|
| ohmic contact layer (p-type layer) | SiH$_4$<br>PH$_3$/H$_2$<br>(500 ppm) | 30<br>60 | 0.3 | 0.5 | 290 | 0.05 |
| graded band gap layer (i-type layer) | SiH$_4$<br>H$_2$<br>GeF$_4$ | 30<br>300 → 0<br>1 → 0 | 0.3 | 0.1 → 0.5 | 290 | **<br>0.1 * 10 = 1 |
| ohmic contact layer (n-type layer) | SiH$_4$<br>B$_2$H$_6$/H$_2$<br>(300 ppm) | 30<br>60 | 0.3 | 0.5 | 290 | 0.05 |

**: 10 layers laminated

What is claimed is:

1. A semiconductor device comprising a band gap grading semiconductor layer region between a p-type semiconductor layer region comprising a p-type silicon-containing non-single-crystal semiconductor material and an n-type semiconductor layer region comprising an n-type silicon-containing non-single-crystal semiconductor material laminated on a substrate, said band gap grading semiconductor layer region forming a junction with said p-type semiconductor layer region and with said n-type semiconductor layer region;

said band gap grading semiconductor layer region comprising a non-single-crystal semiconductor material containing silicon atoms as the main constituent, band gap adjusting atoms and from 1-60 atomic % of hydrogen or halogen atoms as localized level reducing atoms, said band gap grading semiconductor layer region having a region in which a band gap is continuously graded at a position other than said junction; and said band gap grading semiconductor layer region having a conduction band and a valence band, wherein only one of said conduction and valence bands is continuously graded.

2. The semiconductor device according to claim 1, wherein said band gap adjusting atoms are at least one kind of band gap expanding atoms selected from the group consisting of carbon, nitrogen and oxygen atoms.

3. The semiconductor device according to claim 1 wherein said band gap adjusting atoms are at least of a kind of band gap diminishing atoms selected from the group consisting of germanium and tin atoms.

4. The semiconductor device according to claim 1, wherein said band gap grading layer contains a dopant.

5. The semiconductor device according to claim 4, wherein said dopant is a member selected from the group of B, Al, Ga, ln and Tl.

6. The semiconductor device according to claim 4, wherein said dopant is a member selected from the group consisting of P, As, Sb and Bi.

7. The semiconductor device according to claim 1 wherein said band gap is continuously graded so as to widen toward a side thereof through which light can be impinged.

8. A semiconductor device comprising a p-type semiconductor layer region and an n-type semiconductor layer region laminated on a substrate forming a junction between the two semiconductor layer regions, said p-type semiconductor layer region comprising a p-type non-single-crystal semiconductor material containing silicon atoms as the main constituent and said n-type semiconductor layer region comprising an n-type non-single-crystal semiconductor material containing silicon atoms as the main constituent, wherein one of said n-type semiconductor layer region and said p-type semiconductor layer region comprises an band gap grading semiconductor layer region comprising a non-single-crystal semiconductor material further containing dopant atoms, band gap adjusting atoms and from 1 to 60 atomic % of hydrogen or halogen atoms as localized level reducing atoms, said band gap grading semiconductor layer region having a region other than said junction in which a band gap is continuously graded so as to widen toward the side through which light can be impinged, said band gap grading semiconductor layer region having a conduction band and a valence band, only one of said conduction and valence bands being continuously graded.

9. The semiconductor device according to claim 8, wherein said band gap adjusting atoms are one or more kinds of band gap expanding atoms selected from the group consisting of carbon, nitrogen and oxygen atoms.

10. The semiconductor device according to claim 8, wherein said band gap adjusting atoms are at least one or more kinds of band gap diminishing atoms selected from the group consisting of germanium and tin atoms.

* * * * *

UNITED STATES PATENT AND TRADEMARK OFFICE
CERTIFICATE OF CORRECTION

PATENT NO. : 4,887,134
DATED : December 12, 1989
INVENTOR(S) : KEISHI SAITO, ET AL.

Page 1 of 4

It is certified that error appears in the above-identified patent and that said Letters Patent is hereby corrected as shown below:

ON TITLE PAGE:

IN [30] FOREIGN APPLICATION PRIORITY DATA

Insert --Sep. 26, 1986 [JP]  Japan ..... 61-229249--.

IN [57] ABSTRACT

Line 6, "continu-" should read --being continu- --.
    Line 7, "at least" should read --in at least--.

COLUMN 1

Line 14, "at least" should read --at at least--.
    Line 15, "junction" should read --the junction--.
    Line 26, "like-tapered form," should read
            --tapered-like form,--.
    Line 30, "been" should be deleted.
    Line 41, "measure.  Further in addition," should read
            --films.  Further,--.
    Line 48, "free" should read --is free--.
    Line 50, "different" should read --different from--.
    Line 54, "that such" should read --such that--.
    Line 64, "to be" should be deleted.

COLUMN 2

Line 11, "the" (second occurrence) should be deleted.
    Line 13, "be" should read --been--.
    Line 17, "is" should read --are--.
    Line 54, "photomission" should read --photoemission--.

UNITED STATES PATENT AND TRADEMARK OFFICE
CERTIFICATE OF CORRECTION

PATENT NO. : 4,887,134
DATED : December 12, 1989
INVENTOR(S) : KEISHI SAITO, ET AL.

It is certified that error appears in the above-identified patent and that said Letters Patent is hereby corrected as shown below:

COLUMN 3

Line 5, "inventor has" should read --inventors have--.
    Line 11, "material," should read --material)--.
    Line 32, "graded" should read --an improved graded--.
    Line 33, "an improved" should be deleted.
    Line 40, "atom" should be deleted.
    Line 42, "at least" should read --at at least--.
    Line 43, "position" should read --position,--.
    Line 64, "are" and "on the substrate 101" should be deleted.

COLUMN 4

Line 9, "designate" should read --designates--.
    Line 18, "between" should read --both between--.
    Line 19, "also should be deleted.
    Line 65, "in a stable" should read --stably--.

COLUMN 5

Line 12, "that of" should be deleted.
    Line 46, "Photomission" should read --Photoemission--.
    Line 53, "transluent" should read --translucent--.
    Line 54, "electrode" should read --electrode 303--.
    Line 56, "transluent" should read --translucent--.
    Line 59, "meter" should read --meter 307--.

UNITED STATES PATENT AND TRADEMARK OFFICE
CERTIFICATE OF CORRECTION

PATENT NO. : 4,887,134
DATED : December 12, 1989
INVENTOR(S) : KEISHI SAITO, ET AL.

It is certified that error appears in the above-identified patent and that said Letters Patent is hereby corrected as shown below:

COLUMN 6

Line 16, "equation (c):" should read --equation (C):--.
Line 21, "h√" should read --hν--.
Line 32, "characteristic" should read --characteristic)--.
Line 34, "Which" should read --the wider--.

COLUMN 7

Line 15, "an" should read --a--.

COLUMN 8

Line 19, "atomic" (first occurrence) should read --atomic %--.

COLUMN 9

Line 23, "a" should read --an--.
Line 27, "an" should read --a--.
Line 31, "o" should read --to--.

COLUMN 10

Line 21, "a" (second occurrence) should read --an--.

COLUMN 12

Line 47, "S/N ration" should read --S/N ratio--.

UNITED STATES PATENT AND TRADEMARK OFFICE
CERTIFICATE OF CORRECTION

PATENT NO. : 4,887,134
DATED : December 12, 1989
INVENTOR(S) : KEISHI SAITO, ET AL.

Page 4 of 4

It is certified that error appears in the above-identified patent and that said Letters Patent is hereby corrected as shown below:

COLUMN 15

Line 5, "found" should read --formed--.

COLUMN 23

Line 46, "claim 1" should read --claim 1,--.
    Line 54, "group of" should read --group consisting of--.

COLUMN 24

Line 18, "claim 1" should read --claim 1,--.
    Line 33, "an" should read --a--.

Signed and Sealed this

Eleventh Day of February, 1992

Attest:

HARRY F. MANBECK, JR.

*Attesting Officer*       Commissioner of Patents and Trademarks